United States Patent
Cheng et al.

(10) Patent No.: US 7,436,006 B2
(45) Date of Patent: Oct. 14, 2008

(54) HYBRID STRAINED ORIENTATED SUBSTRATES AND DEVICES

(75) Inventors: Kangguo Cheng, Beacon, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 11/419,308

(22) Filed: May 19, 2006

(65) Prior Publication Data

US 2007/0267634 A1    Nov. 22, 2007

(51) Int. Cl.
H01L 31/072   (2006.01)
H01L 31/109   (2006.01)

(52) U.S. Cl. ...................... 257/192; 257/194
(58) Field of Classification Search ............. 257/19–20, 257/192, 347, 369, 194; 438/198–199
See application file for complete search history.

(56) References Cited

U.S. PATENT DOCUMENTS 6,399,970 B2 *  6/2002  Kubo et al. ............... 257/194
6,815,278 B1    11/2004  Ieong et al.
2004/0256700 A1  12/2004  Doris et al.
2004/0266076 A1  12/2004  Doris et al.
2005/0093021 A1 *  5/2005  Ouyang et al. ............ 257/194

* cited by examiner

Primary Examiner—Theresa T Doan
(74) Attorney, Agent, or Firm—Schmeiser, Olson & Watts; Steven Capella

(57) ABSTRACT

A semiconductor structure and a method for forming the same. The method includes providing a semiconductor structure which includes (a) substrate, (b) a first semiconductor region on top of the substrate, wherein the first semiconductor region comprises a first semiconductor material and a second semiconductor material, which is different from the first semiconductor material, and wherein the first semiconductor region has a first crystallographic orientation, and (c) a third semiconductor region on top of the substrate which comprises the first and second semiconductor materials and has a second crystallographic orientation. The method further includes forming a second semiconductor region and a fourth semiconductor region on top of the first and the third semiconductor regions respectively. Both second and fourth semiconductor regions comprise the first and second semiconductor materials. The second semiconductor region has the first crystallographic orientation, whereas the fourth semiconductor region has the second crystallographic orientation.

9 Claims, 6 Drawing Sheets

HYBRID STRAINED ORIENTATED SUBSTRATES AND DEVICES

BACKGROUND OF THE INVENTION

1. Technical Field

The present invention relates to semiconductor substrates and devices, and more specifically, to Hybrid Strained Orientated Substrates and Devices.

2. Related Art

In a typical semiconductor fabrication process, the P-channel transistors are preferably formed on (110) crystallographic oriented, compressively strained semiconductor region of a substrate, whereas the N-channel transistors are preferably formed on (100) crystallographic oriented, tensily strained semiconductor regions of the same substrate to optimize the operation of transistors. Therefore, there is a need for a method of forming a substrate that has both (110) crystallographic oriented, compressively strained and (100) crystallographic oriented, tensily strained semiconductor regions.

SUMMARY OF THE INVENTION

The present invention provides a semiconductor structure, comprising (a) a substrate; (b) a first semiconductor region on the substrate, wherein the first semiconductor region comprises a first semiconductor material and a second semiconductor material, which is different from the first semiconductor material, and wherein the first semiconductor region has a first crystallographic orientation; (c) a second semiconductor region on the first semiconductor region, wherein the second semiconductor region comprises the first and second semiconductor materials, and wherein the second semiconductor region has the first crystallographic orientation; (d) a third semiconductor region on the substrate, wherein the third semiconductor region comprises the first and second semiconductor materials, and wherein the third semiconductor region has a second crystallographic orientation; and (e) a fourth semiconductor region on the third semiconductor region, wherein the fourth semiconductor region comprises the first and the second semiconductor materials, wherein the fourth semiconductor region has the second crystallographic orientation, wherein a first ratio in number of atoms of the first semiconductor material to the second semiconductor material in the first semiconductor region is smaller than a second ratio in number of atoms of the first semiconductor material to the second semiconductor material in the second semiconductor region, and wherein a third ratio in number of atoms of the first semiconductor material to the second semiconductor material in the third semiconductor region is greater than a fourth ratio in number of atoms of the first semiconductor material to the second semiconductor material in the fourth semiconductor region.

The present invention provides a semiconductor structure fabrication method, comprising providing a semiconductor structure which includes (a) a substrate, (b) a first semiconductor region on top of the substrate, wherein the first semiconductor region comprises a first semiconductor material and a second semiconductor material, which is different from the first semiconductor material, and wherein the first semiconductor region has a first crystallographic orientation, and (c) a third semiconductor region on top of the substrate, wherein the third semiconductor region comprises the first and the second semiconductor materials, and wherein the third semiconductor region has a second crystallographic orientation; and forming a second semiconductor region and a fourth semiconductor region on top of the first and the third semiconductor regions respectively, wherein the second semiconductor region comprises the first and the second semiconductor materials, wherein the second semiconductor region has the first crystallographic orientation, wherein the fourth semiconductor region comprises the first and the second semiconductor materials, and wherein the fourth semiconductor region has the second crystallographic orientation.

The present invention provides the substrate (method for forming the same) that has both (110) crystallographic oriented, compressively strained and (100) crystallographic oriented, tensily strained semiconductor regions.

DETAILED DESCRIPTION OF THE INVENTION

Figure 1:
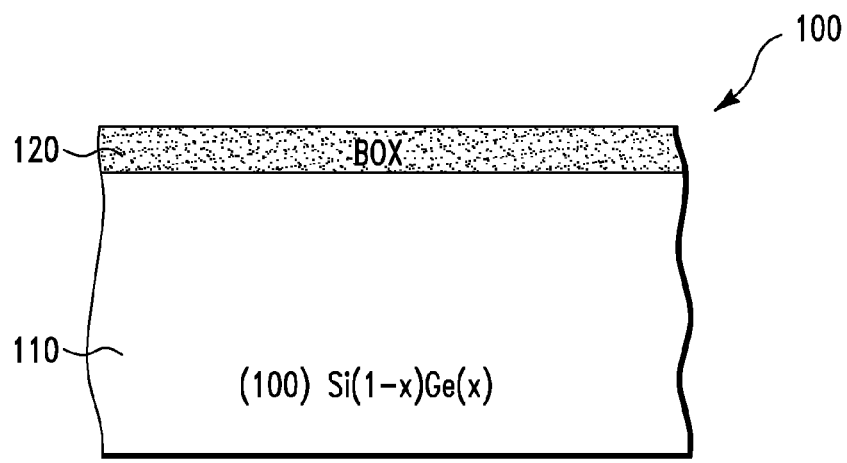
FIGS. 1-15 show cross-section views of a semiconductor device structure going through a fabrication process, in accordance with embodiments of the present invention.

FIGS. 1-15 show cross-section views of a semiconductor device structure 100 going through a fabrication process, in accordance with embodiments of the present invention. More specifically, with reference to FIG. 1, in one embodiment, the fabrication process of the structure 100 starts with a semiconductor substrate 110. Illustratively, the semiconductor substrate 110 comprises a mixture of silicon and germanium and has a crystallographic orientation of (100). It should be noted that the phrase "Si(1−x)Ge(x)" in FIG. 1 indicates the ratio between the number of silicon atoms and the number of germanium atoms in the mixture is (1−x)/x, wherein the value of x is between 0 and 1. In an alternative embodiment, the semiconductor substrate 110 comprises only germanium.

Next, in one embodiment, an insulating layer 120 such as a BOX (Buried oxide) layer is formed on top of the semiconductor substrate 110. Illustratively, the BOX layer 120 comprises silicon dioxide ($SiO_2$). In one embodiment, the BOX layer 120 can be formed by thermal oxidation. In an alternative embodiment, the insulating layer 120 is omitted.

Figure 2:
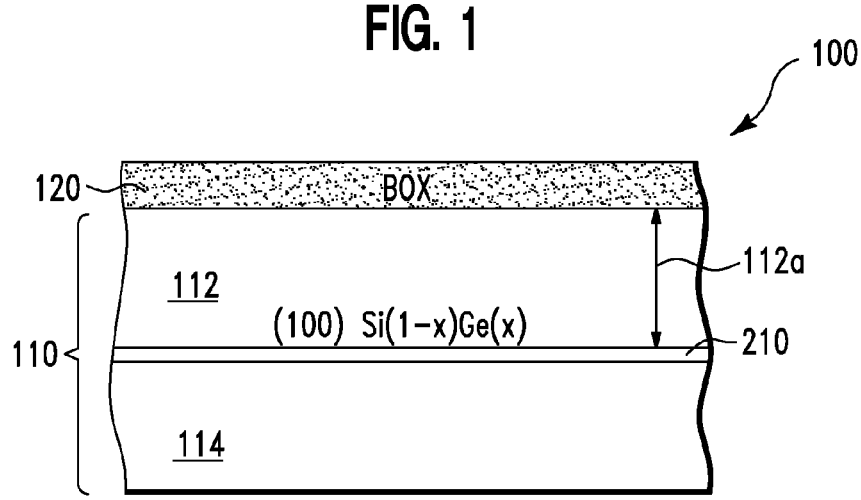

Next, with reference to FIG. 2, in one embodiment, an implanted hydrogen ion layer 210 is formed in the substrate 110. Illustratively, the implanted hydrogen ion layer 210 is formed by ion implantation of hydrogen ions. It should be noted that, the implanted hydrogen ion layer 210 divides the semiconductor substrate 110 into two semiconductor layers 112 and 114. In one embodiment, the thickness 112a of the semiconductor layer 112 is very thin and controlled.

Figure 3:
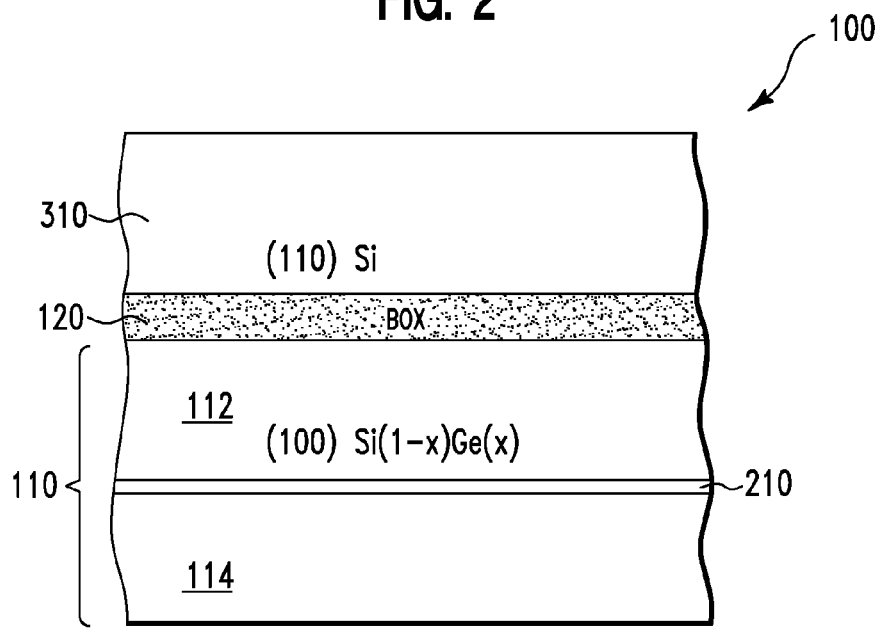
Figure 4:
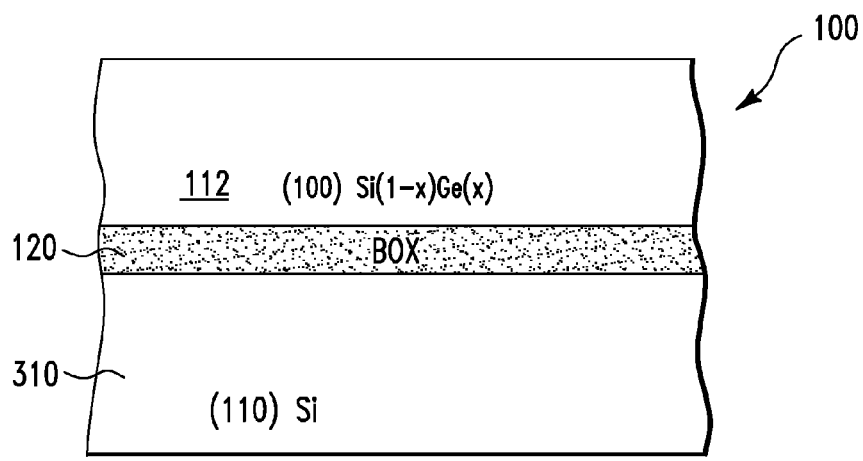

Next, in one embodiment, with reference to FIG. 3, a semiconductor layer 310 is bonded on top of the BOX layer 120 resulting in the structure 100 of FIG. 3. In an alternative embodiment, no insulating layer 120 is formed on top of the semiconductor substrate 110 and the semiconductor layer 310 is directly bonded on top of the semiconductor layer 110. Illustratively, the layer 310 comprises silicon and has a crystallographic orientation of (110).

Next, in one embodiment, the structure 100 of FIG. 3 can be annealed so that the structure 100 of FIG. 3 splits along the hydrogen ion layer 210. The upper portion of the structure 100 of FIG. 3 after the split, illustratively, is turned upside down resulting in the structure 100 of FIG. 4.

Figure 5:
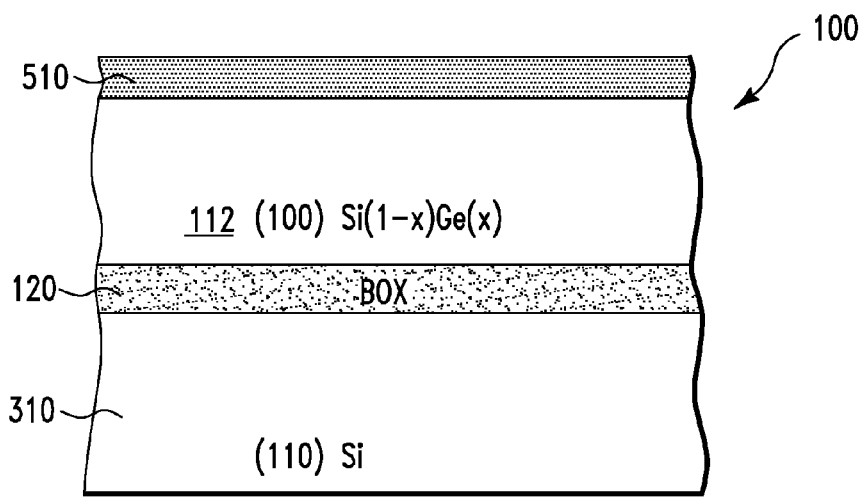

Next, with reference to FIG. 5, in one embodiment, a pad layer 510 is formed on top of the semiconductor layer 112. Illustratively, the pad layer 510 comprises a silicon nitride layer and an optional underlying oxide layer. The silicon nitride layer can be formed by CVD (Chemical vapor deposition) and the underlying oxide layer may be formed by thermal oxidation or by CVD. Next, in one embodiment, the pad layer 510 is patterned resulting in the structure 100 of FIG. 5A. Illustratively, the patterning of the pad layer 510 involves a lithographic process and one or multiple etching process.

Figure 5A:
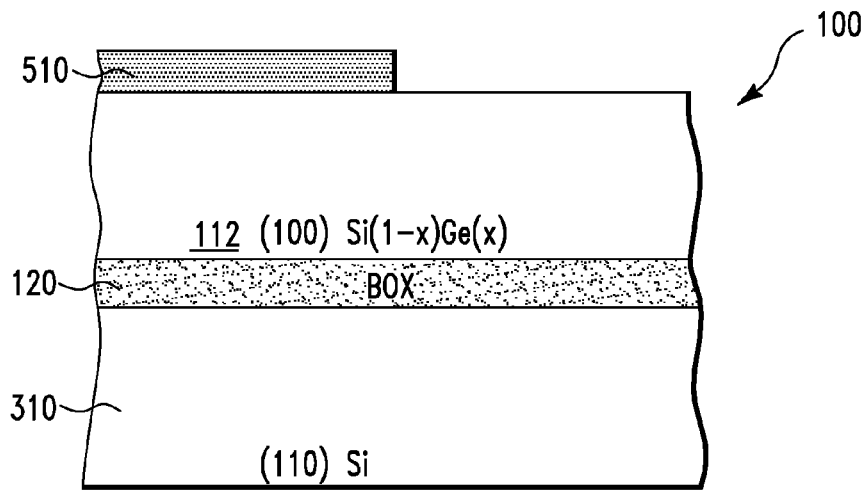
Figure 6:
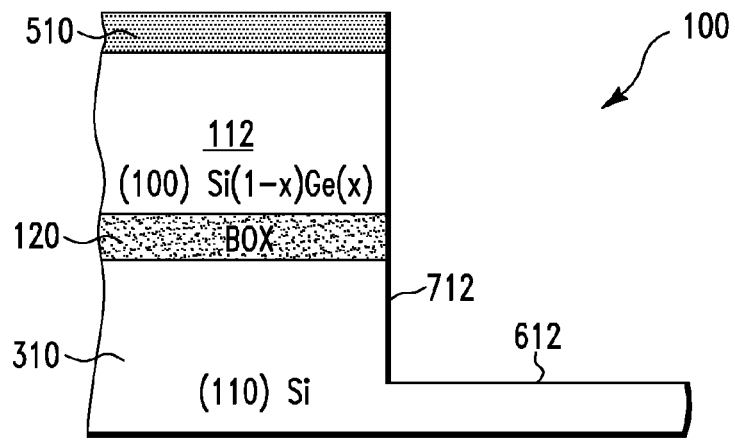

Next, with reference to FIG. 5A, in one embodiment, the patterned pad layer 510 is used as a mask for selectively etching the semiconductor layer 112, the BOX layer 120, and the semiconductor layer 310 resulting in the structure 100 of FIG. 6. Illustratively, the etching of the semiconductor layer 112, the BOX layer 120 and the semiconductor layer 310 involves a conventional etching process. Alternatively, the pad layer 510, the semiconductor layer 112, the BOX layer 120, and the semiconductor layer 310 are patterned by using photoresist (not shown) as a mask, resulting in the same structure 100 shown in FIG. 6.

Figure 7:
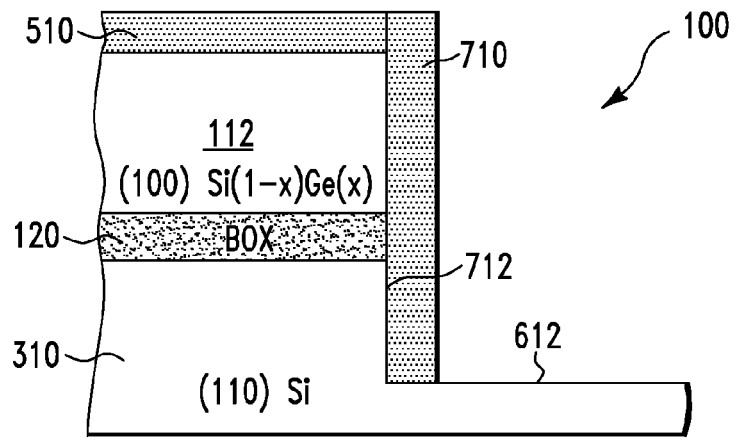

Next, in one embodiment, with reference to FIG. 7, a spacer 710 is formed on the side wall 712 of structure 100. Illustratively, the spacer 710 comprises silicon oxide or silicon nitride. In one embodiment, the spacer 710 is formed by (i) depositing a spacer layer (not shown) on top of the structure 100 of FIG. 6 by CVD and then (ii) directionally etching the deposited spacer layer resulting in structure 100 of FIG. 7.

Figure 8A:
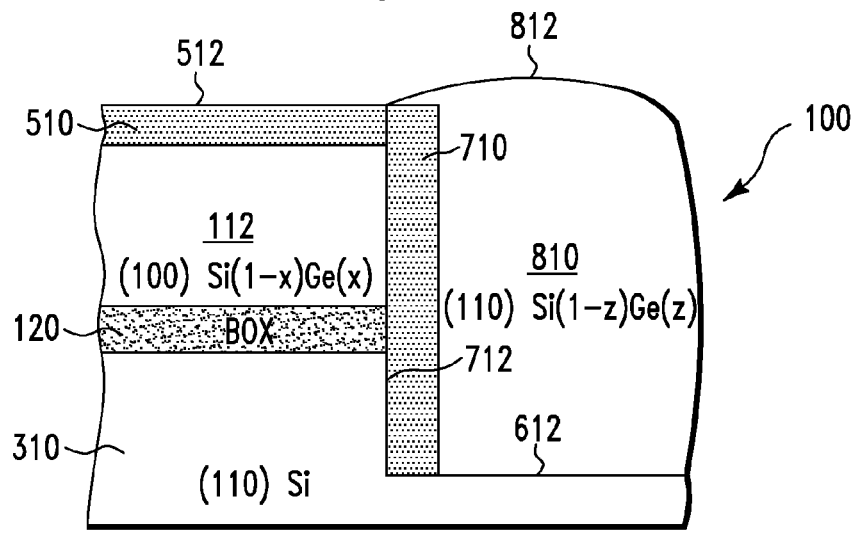

Next, in one embodiment, with reference to FIG. 8A, a semiconductor region 810 is formed on the surface 612 of the structure 100. Illustratively, the semiconductor region 810 comprises a mixture of silicon and germanium and has a crystallographic orientation of (110). It should be noted that the phrase "Si(1−z)Ge(z)" in FIG. 8A indicates the ratio between the number of silicon atoms and the number of germanium atoms in the mixture is (1−z)/z, wherein the value of z is between 0 and 1. In one embodiment, z is smaller than x (i.e., z<x), i.e., the concentration of germanium in the semiconductor region 810 is less than the germanium concentration in the semiconductor layer 112. Illustratively, the semiconductor region 810 is formed by epitaxial growth. In one embodiment, the epitaxial growth is performed until the top surface 812 of the semiconductor region 810 is at a higher level than the top surface 512 of the nitride layer 510.

Figure 8B:
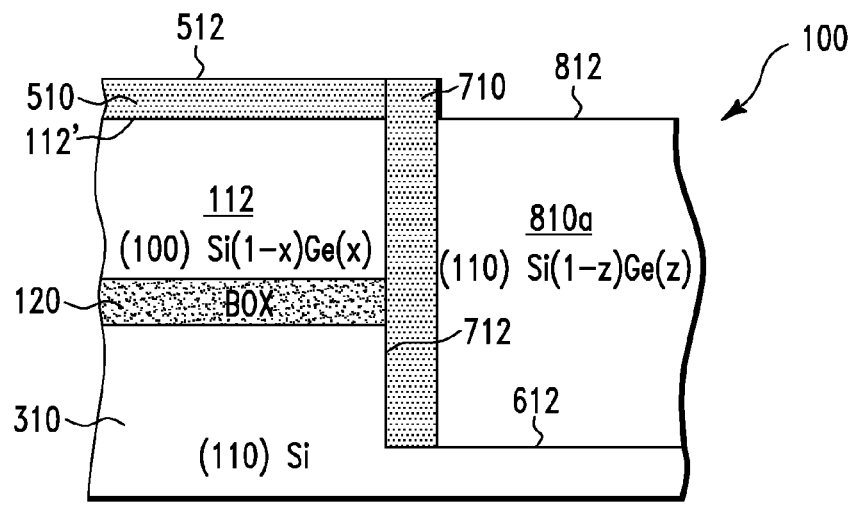

Next, in one embodiment, the semiconductor region 810 is recessed until the top surface 812 of the semiconductor region 810 is coplanar with top surface 112' of the semiconductor layer 112 resulting in the structure 100 of FIG. 8B. In one embodiment, the semiconductor region 810 is recessed by a reactive ion etching (RIE) process. In an alternative embodiment, the semiconductor region 810 is recessed by oxidizing the excessive semiconductor in region 810 and then selectively removing the formed oxide. Optionally, a planarization process such as CMP (chemical mechanical polishing) can be performed before the recess process. It should be noted that what remains of the semiconductor region 810 (FIG. 8A) after the recessing can be referred to as a semiconductor region 810a (FIG. 8B).

Figure 9:
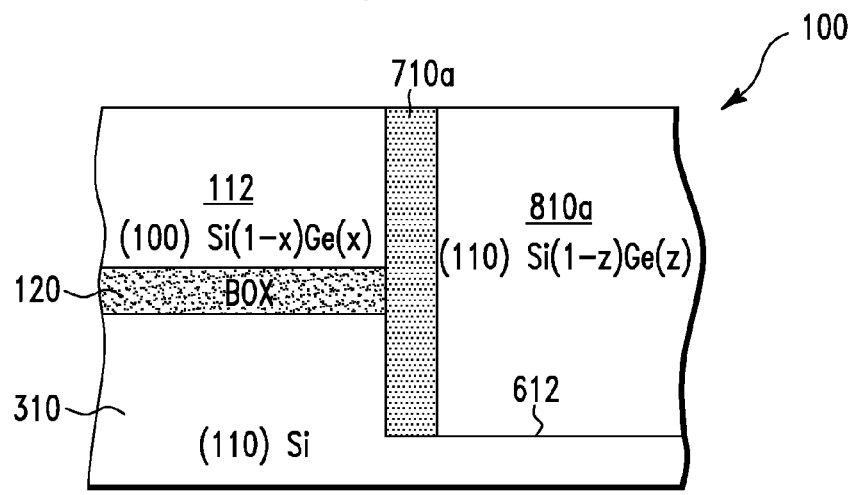

Next, in one embodiment, the structure 100 of FIG. 8B is subjected to an etch process such as a wet etching process or a plasma etching process, which strips off the patterned pad layer 510 and a top portion of the spacer 710 to expose the top surface 112' of the semiconductor layer 112 to the surrounding ambient resulting in the structure 100 of FIG. 9. It should be noted that what remains of the spacer 710 after the etching can be referred to as a spacer 710a.

Figure 10:
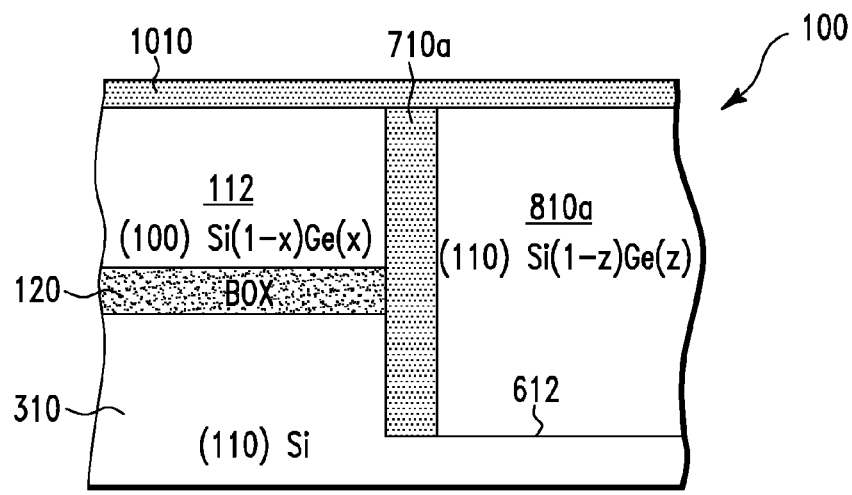

Next, with reference to FIG. 10, in one embodiment, a hard mask layer 1010 is formed on top of the structure 100 of FIG. 9. Illustratively, the hard mask layer 1010 comprises a silicon nitride layer and an optional underlying silicon oxide layer. In one embodiment, the hard mask layer 1010 is formed on top of the structure 100 of FIG. 9 by thermal oxidation followed by CVD of silicon nitride.

Figure 11:
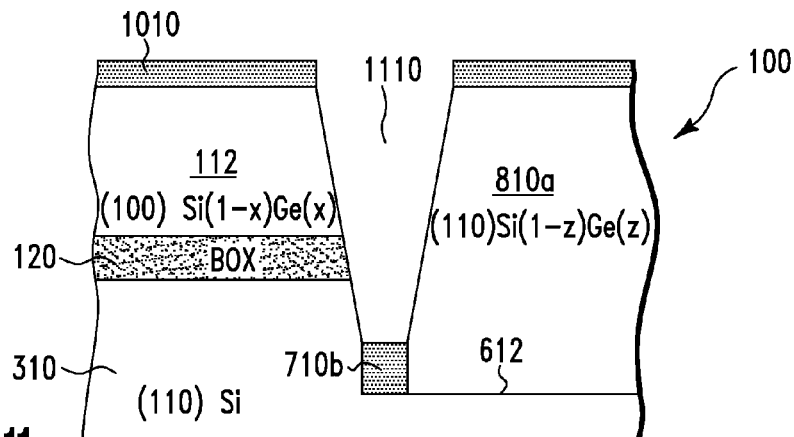

Next, in one embodiment, with reference to FIG. 11, a trench 1110 is formed in the structure 100. The trench 1110 is created at the location where the nitride spacer 710a of FIG. 10 was. In one embodiment, the trench 1110 is formed by a conventional lithographic and etching process.

Figure 12:
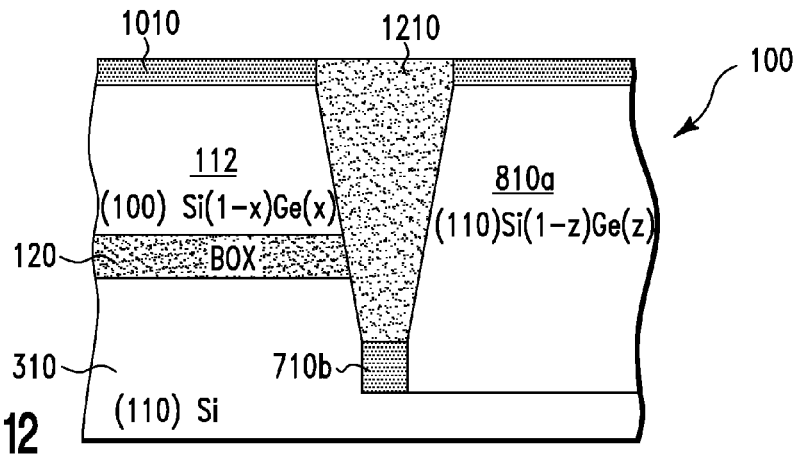

Next, in one embodiment, with reference to FIG. 12, a shallow trench isolation (STI) region 1210 is formed in the trench 1110 of FIG. 11. Illustratively, the shallow trench isolation (STI) region 1210 comprises silicon dioxide. In one embodiment, the STI region 1210 is formed by filling the trench 1110 in FIG. 11 with silicon dioxide followed by a planarization process such as CMP.

Figure 13:
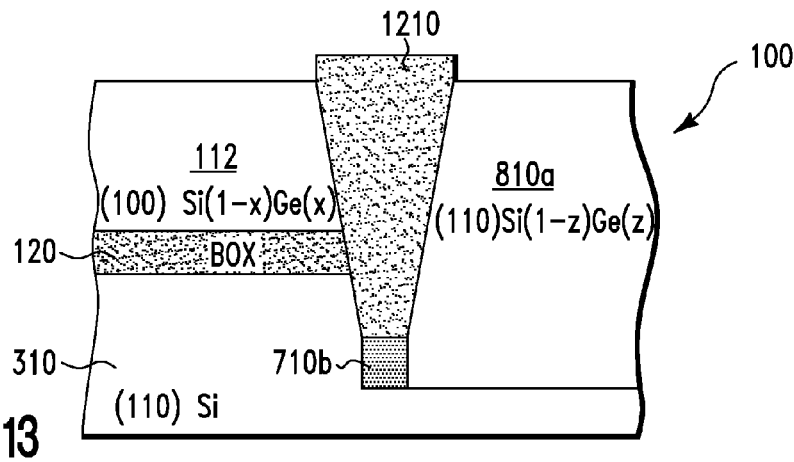

Next, in one embodiment, the hard mask layer 1010 is removed resulting in the structure 100 of FIG. 13. Illustratively, the hard mask layer 1010 is removed by wet etching.

Figure 14:
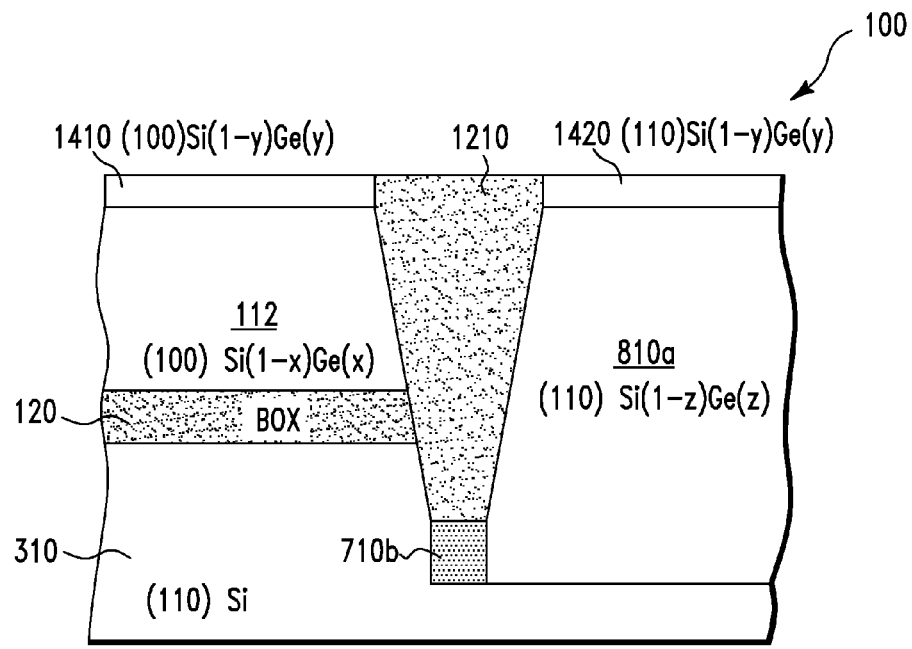

Next, in one embodiment, with reference to FIG. 14, two semiconductor layers 1410 and 1420 are grown simultaneously on top of semiconductor layers 112 and 810a, respectively. Illustratively, the semiconductor layers 1410 and 1420 comprise a mixture of silicon and germanium. It should be noted that the phrase "Si(1−y)Ge(y)" in FIG. 14 indicates the ratio between the number of silicon atoms and the number of germanium atoms in the mixture is (1−y)/y, wherein the value of y is between 0 and 1. In one embodiment, the value of y is between the values of x and z (i.e., x>y>z). Illustratively, the semiconductor layers 1410 and 1420 are formed by epitaxial growth followed by CMP. Because the semiconductor layer 1410 is grown on the semiconductor layer 112; as a result, the crystallographic orientation of semiconductor layer 1410 is the same as the crystallographic orientation of the semiconductor layer 112 (i.e., (100)). Similarly, the semiconductor layer 1420 is grown on the semiconductor layer 810a; as a result, the crystallographic orientation of semiconductor layer 1420 is the same as the crystallographic orientation of the semiconductor layer 810a (i.e., (110)). It should be noted that the percentage of germanium atoms in the mixture in the semiconductor layer 1410 is less than that in the semiconductor layer 112 (i.e., y<x); as a result, the semiconductor layer 1410 is tensily strained. On the other hand, the percentage of germanium atoms in the mixture in the semiconductor layer 1420 is more than that in the semiconductor layer 810a (i.e., y>z); as a result, the semiconductor layer 1420 is compressively strained.

Figure 15:
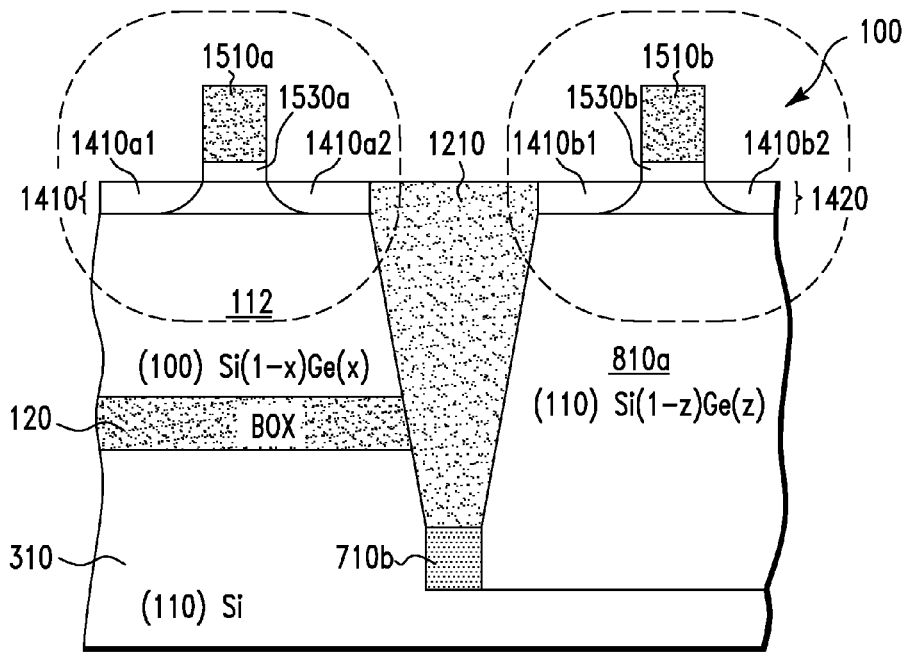

Next, in one embodiment, with reference to FIG. 15, an N-channel transistor 1590a and a P-channel transistor 1590b are formed on the semiconductor layers 1410 and 1420 respectively. Illustratively, the N-channel transistor 1590a comprises a gate electrode 1510a, a gate dielectric layer 1530a, two source/drain regions 1410a1 and 1410a2. In one embodiment, the N-channel transistor 1590a is formed by a conventional method. Similarly, the P-channel transistor 1590b comprises a gate electrode 1510b, a gate dielectric layer 1530b, two source/drain regions 1410b1 and 1410b2. Illustratively, the P-channel transistor 1590b is formed by a conventional method. It should be noted that, the N-channel transistor 1590a is formed on (100), tensily strained semiconductor material; as a result, the operation of N-channel transistor 1590a is optimized. Similarly, the P-channel transistor 1590b is formed on (110), compressively strained semiconductor material; as a result, the operation of P-channel transistor 1590b is optimized. In one embodiment, the P-channel transistor 1590b and the N-channel transistor 1590a are electrically connected to form a CMOS device.

In the embodiments described above, the regions 112, 810a, 1410, and 1420 comprise a mixture of silicon and germanium. Alternatively, the regions 112, 810a, 1410, and 1420 can comprise a mixture of silicon and carbon. In this case, the crystallographic orientation of the regions 310, 112, 810a, 1410, and 1420 should be swapped. More specifically, with reference to FIG. 14, the crystallographic orientation of the semiconductor layers 310, 810a and 1420 is (100), whereas the crystallographic orientation of the semiconductor layers 112 and 1410 is (110). In this case, the ratio between the number of silicon atoms and the number of carbon atoms in the mixture of 112 is $(1-x)/x$; the ratio between the number of silicon atoms and the number of carbon atoms in the mixture of 810a is $(1-z)/z$; and the ratio between the number of silicon atoms and the number of carbon atoms in the mixture of 1410 and 1420 is $(1-y)/y$, wherein $x>y>z$.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure, comprising:
   (a) a substrate;
   (b) a first semiconductor region on the substrate,
      wherein the first semiconductor region comprises a first semiconductor material and a second semiconductor material, which is different from the first semiconductor material, and
      wherein the first semiconductor region has a first crystallographic orientation;
   (c) a second semiconductor region on the first semiconductor region,
      wherein the second semiconductor region comprises the first and second semiconductor materials, and
      wherein the second semiconductor region has the first crystallographic orientation;
   (d) a third semiconductor region on the substrate,
      wherein the third semiconductor region comprises the first and second semiconductor materials, and
      wherein the third semiconductor region has a second crystallographic orientation different than the first crystallographic orientation; and
   (e) a fourth semiconductor region on the third semiconductor region,
      wherein the fourth semiconductor region comprises the first and the second semiconductor materials,
      wherein the fourth semiconductor region has the second crystallographic orientation,
      wherein a first ratio in number of atoms of the first semiconductor material to the second semiconductor material in the fist semiconductor region is smaller than a second ratio in number of atoms of the first semiconductor material to the second semiconductor material in the second semiconductor region,
      wherein a third ratio in number of atoms of the first semiconductor material to the second semiconductor material in the third semiconductor region is greater than a fourth ratio in number of atoms of the first semiconductor material to the second semiconductor material in the fourth semiconductor region,
      wherein the first semiconductor material comprises silicon, and
      wherein the second semiconductor material comprises carbon.

2. The semiconductor structure of claim 1, wherein the second ratio is equal to the fourth ratio.

3. The semiconductor structure of claim 1, wherein the first semiconductor material comprises silicon, wherein the second semiconductor material comprises germanium.

4. The semiconductor structure of claim 1,
   wherein the first crystallographic orientation is (100), and
   wherein the second crystallographic orientation is (110).

5. The semiconductor structure of claim 1, wherein the second semiconductor region is tensily strained and the fourth semiconductor region is compressively strained.

6. The semiconductor structure of claim 1, further comprising:
   an N-channel transistor formed on the second semiconductor region; and
   a P-channel transistor formed on the fourth semiconductor region.

7. The semiconductor structure of claim 1, wherein the second semiconductor region is compressively strained and the fourth semiconductor region is tensily strained.

8. The semiconductor structure of claim 1, further comprising a trench isolation region, wherein the trench isolation region (i) is sandwiched between, (ii) is in direct physical contacted with, and (iii) electrically isolates the first and third semiconductor regions.

9. The semiconductor structure of claim 8, wherein the trench isolation region (i) is sandwiched between, (ii) is in direct physical contacted with, and (iii) electrically isolates the second and fourth semiconductor regions.

* * * * *